United States Patent [19]

Ashbee

[11] 4,086,470
[45] Apr. 25, 1978

[54] HARDWARE-SOFTWARE COUNTING

[75] Inventor: William Henry Ashbee, Boulder, Colo.

[73] Assignee: International Business Machines Corporation, Armonk, N.Y.

[21] Appl. No.: 754,766

[22] Filed: Dec. 27, 1976

[51] Int. Cl.$^2$ .................... G06M 3/14; H03K 21/10
[52] U.S. Cl. .................. 235/92 DP; 235/92 EA; 235/92 EV; 235/92 R; 364/900
[58] Field of Search ........ 235/92 EV, 92 DP, 92 MP, 235/92 EA

[56] References Cited

U.S. PATENT DOCUMENTS

| 3,297,859 | 1/1967 | Reiser | 235/92 EV |
| 3,391,342 | 7/1968 | Gordon et al. | 235/92 EV |
| 3,500,022 | 3/1970 | Toscano | 235/92 EV |
| 3,513,468 | 5/1970 | Fluegel | 235/92 EV |
| 3,967,095 | 6/1976 | Herring et al. | 235/92 DP |

Primary Examiner—Joseph M. Thesz
Attorney, Agent, or Firm—Herbert F. Somermeyer

[57] ABSTRACT

A hardware counter counts high rate, lower significant bits. A carry-borrow circuit responsive to the higher order bit position of the hardware counter includes cancel means responsive to successively received carry and borrow signals to cancel previously generated carries or borrows. Memory means in the carry-borrow circuit memorize the generation of the carry or borrow by the hardware counter. A programmed microprocessor, or the like, periodically senses the status of the carry-borrow circuit for transferring signal contents thereof to a software controlled count field. The arrangement permits high speed counting without interrupting the microprocessor and not imposing rate constraints on program execution of the microprocessor.

8 Claims, 2 Drawing Figures

HARDWARE-SOFTWARE COUNTING

BACKGROUND OF THE INVENTION

The present invention relates to counting apparatus particularly useful for rate counting in connection with a positioning servo system.

Counters both of the hardware and software type have been used for years in connection with not only tallying events, but in control applications. Generally, high rate counting is achieved through so-called hardware counters; i.e., a combination of logic switching circuits used and interconnected in accordance with a predetermined counting algorithm. Where large count fields are desired, such counters have been connected to programmed data processors. The operation generally required an interrupt of the data processor to respond to the counter; that is, a carry, borrow or other type of overflow signal from the hardware counter would interrupt the execution of programs in the data processor. The data processor, in turn, would then read a buffer containing measurement data to be written on a recording medium such as magnetic tape or magnetic disk, or the contents of the counter could be read into the data processor.

In certain control applications programmable controllers taking the form of microprocessors or microcomputers have severe cost constraints. Therefore, the compute power of the microprocessor and its ability to rapidly execute a program is limited. When a data processor is interrupt driven, it must have capacity in excess of what many microprocessors presently offer. Therefore, it is highly undesirable in a low cost controller application of a programmed data processor, of the microcomputer type for example, to be entirely interrupt driven for controlling diverse apparatus. This avoidance of the interrupt driver is particularly advantageous in positioning systems having stop/lock conditions where the members being controlled are subject to oscillations about a reference point. The counter tracking the positional movements may go from all ones to all zeros and back again, having a series of borrows and carries which would dominate the operation of the programmed data processor. Such domination could prevent the processor from handling other time dependent control functions. Accordingly, rather than adding a larger counter which, while providing precision, can affect the servo characteristics in an adverse manner, other more viable low cost solutions are desired.

SUMMARY OF THE INVENTION

It is an object of the invention to provide a hardware-soft counter having communications independent of the hardware counter status and without requiring interruption of the data processor.

A hardware-software counter constructed in accordance with the teaching of the invention provides a hardware counter external to the data processor and a program in the data processor which periodically samples a counter coupling circuit coupling the hardware counter to the data processor. The coupling circuit, a carry-borrow circuit, includes memory means for storing last received carries or borrows including cancellation means for cancelling successive carries and borrows without destroying the precision of the hardward count.

In a specific embodiment the carry-borrow circuit includes a decoder, a memory means including a borrow latch and a carry latch, the latches receive setting and resetting signals from the decoding means which in turn receive count values, i.e., borrows and carries, from the hardware counter. The status of the carry and borrow latches indicate to the microprocessor upon its periodic sampling the most recent status of the hardware counter. The microprocessor generally has the ability to read the signal contents of the hardware counter in addition to the signal contents of the carry-borrow circuit.

The foregoing and other objects, features and advantages of the invention will be apparent from the following more particular description of the preferred embodiment of the invention, as illustrated in the accompanying drawings.

DETAILED DESCRIPTION

Figure 1:
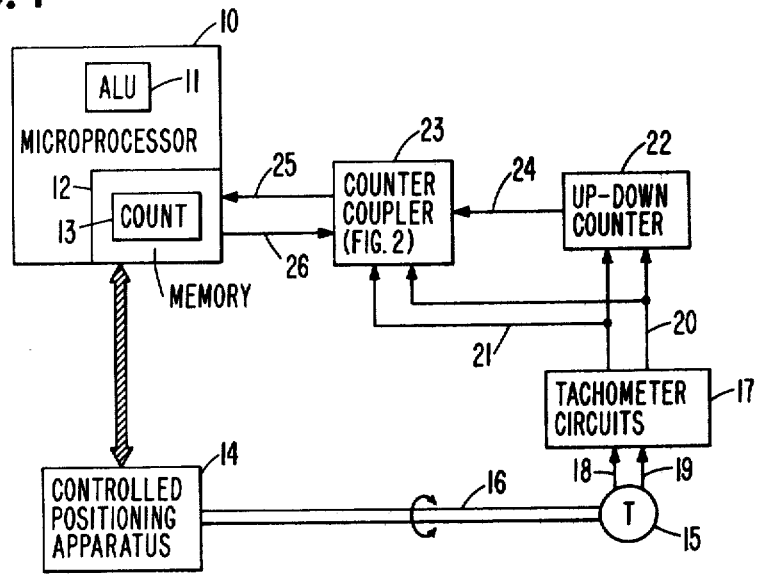
FIG. 1 is a diagrammatic showing of a positioning control apparatus taking advantage of the present invention.

Microprocessor 10 which includes an ALU (arithmetic-logic unit which adds, subtracts and performs modulo 2 logic 11, memory 12, having a register 13 designated for containing a count field, controls positioning apparatus 14. The positioning apparatus 14 positional state is indicated by a tachometer 15 mounted on a shaft 16 of apparatus 14. Tachometer circuits 17 receive two phase tachometer signals respectively over lines 18 and 19 from tachometer 15. For example, tachometer 15 may include light emitting diodes (not shown) with photosensitive transistors (not shown) for generating the two phase tachometer signals on lines 18, 19 in response to tachometer patterns (not shown) on a tachometer disk (not shown) of tachometer 15. All of the above with respect to the tachometer operation are of normal design and well known in the art.

Circuits 17 analyze the tachometer signals on lines 18, 19 and supply two phase derived tachometer indicating signals for indicating direction on line 20 and rate on line 21 to up/down counter 22 and counter coupler 23. Up/down counter 22 responds to the direction signals on line 20 to count at a rate indicated by the signals on line 21 in one of two directions in accordance with the direction of tachometer 15 signals thereby accurately indicating the positional status of apparatus 14.

Counter coupler 23 responds to the lines 20, 21 signals and to up/down counter 22 to generate count indicating signals for use by microprocesser 10 without interrupt, as will become apparent.

Up/down counter 22 supplies borrow-carry signals over line 24 to counter coupler circuit which merges the signals with the lines 20, 21 signals to indicate to microprocessor 10 up/down counter 22 status. Counter coupler 23 supplies such indicating signals over cable 25 to microprocessor 10 for its sensing at its determined time, no interrupt being provided. Microprocessor 10 upon sensing the status signals supplied by cable 25 resets counter coupler circuit 23 via a reset signal supplied over line 26.

Figure 2:
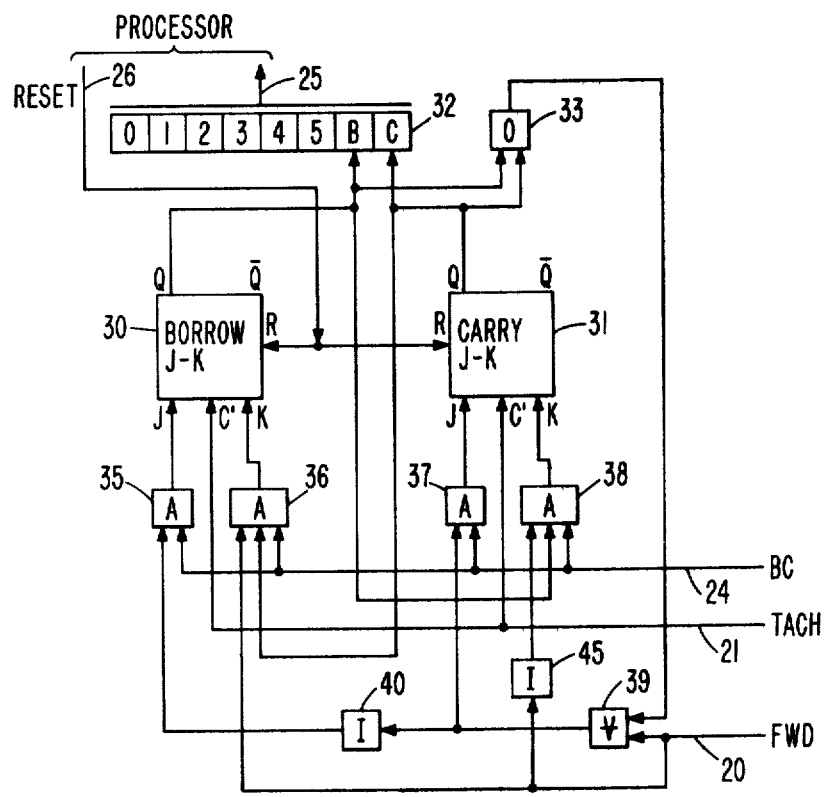
FIG. 2 illustrates a counter coupling circuit of the carry-borrow type usable with the FIG. 1 illustrated positioning control apparatus.

Referring to FIG. 2, counter coupler 23 includes a pair of memory latches 30, 31 of the JK type respectively for storing borrow and carry signals received over line 24. Latch 30 supplies the memorized borrow signal B to register 32 by setting the B bit of that register for transmittal over cable 25. Similarly, carry latch 31 supplies the memorized C signal to the C bit of register 32 for transmittal to microprocessor 10 via cable 25. Additionally, OR circuit 33 combines the memorized B and C signals from latches 30, 31 to supply a control signal to the later described decoder including circuit 39.

Assume that both latches 30, 31 are reset. A borrow-carry signal is supplied to coupler 23 from up/down counter 22 over line 24. This signal is supplied to four AND circuits 35, 36, 37 and 38, respectively inputting to latches 30, 31 and forming part of the tachometer coder. The JK latches 30, 31 are timed at the C (clock) inputs by the received tachometer signal on line 21. AND circuit 35 supplies a J input to latch 30 whenever it receives a borrow-carry signal on line 24 plus an inversion of the EXCLUSIVE-OR decoder circuit 39. EXCLUSIVE-OR circuit 39 EXCLUSIVE-ORs the states of latches 30, 31 with the forward input signal received over line 20; i.e., when line 20 is active up/down counter should be counting up, and when inactive up/down counter 22 should be counting down. Since both latches 30, 31 are reset, EXCLUSIVE-OR circuit 39 will supply an active signal if line 20 is active. Inverter circuit 40 then supplies an inactive signal to AND circuit 35 preventing latch 30 from being set. Accordingly, when both latches are reset and a backward indication is indicated by line 20, i.e., tachometer 15 is indicating the apparatus is moving in the reverse direction, then the line 24 active signal indicates a borrow causing the J input from AND circuit 35 to set JK latch 30 in accordance with known JK latch operational algorithms.

AND circuit 36 supplies the K input to latch 30 and is activated when the carrier latch 31 has been set as later described and the forward signal 20 is active. This means the borrow is being erased in latch 30; i.e., cancelled by the carry latch 31 being set when the positioning apparatus is moved in the forward direction.

AND circuit 37 provides a J input to JK latch 31. AND circuit 37, of course, receives the borrow-carry signal over line 24 and the output of EXCLUSIVE-OR 39. A carry is set if neither of the latches 30, 31 are set and the apparatus is moving in the forward direction, as indicated by the line 20 signal. If the apparatus is moving in the reverse direction and either of the latches 30, 31 is set to the active condition, then the J input of carry latch 31 is activated. It should be noted that latch 31 being set with the J input will provide a different JK function than if the borrow latch 30 is set.

Finally, AND circuit 38 provides the K input to the JK latch 31 in a similar manner to the AND 36 input to latch 30. A difference being is that inverter circuit 45 supplies a backward signal to AND circuit 38 by inverting the forward signal from line 20. Therefore, the carry latch 31 is reset in the backward direction in the same manner that the borrow latch 30 is reset in the forward direction. Of course, the other algorithmic functions of the K input in the JK flip-flop will be performed and can be determined by applying the algorithm of the JK flip-flop to the illustrated circuit.

When the microprocessor 10 has received the B and C indications from latches 30, 31 via register 32 both latches are reset for starting the sensing sequence over again. Not shown but assumed is that microprocessor 10 has reading access to up/down counter 22. This is, up/down counter 22 may supply its count signals to a register similar to register 32 for transmittal to microprocessor 10 for determining fine counts as may be necessary in controlling apparatus 14. It is important to note that the counter can be conveniently fed to the high order six bits of register 32 (0-5) for integrity of count information. On the other hand, if such fine counts are not necessary such connections may be dispensed with.

Microprocessor 10 has a program (not shown) generating a count field by supplying signals through the ALU 11. A C input, i.e., a carry from up/down counter 22, causes a one to be added to the count field, while a borrow indicated by bit B of register 32 causes a one to be subtracted from the count field. If both bits B and C are zero, i.e., both latches 30, 31 are reset, then the count field in memory 12 is not altered. On the other hand, if both latches are ones an error condition is indicated because the algorithms of the JK flip-flops have not been successful to cancel the borrow and carry in a case where a borrow is followed by a carry or a carry is followed by a borrow. Also, in cases where microprocessor 10 did not service borrow or carry when tape is in motion, and two successive borrows or carries occurred, an error occurs.

While the invention has been particularly shown and described with references to preferred embodiments thereof, it will be understood by those skilled in the art that various changes in form and details may be made therein without departing from the spirit and scope of the invention.

What is claimed is:

1. A hardware-software counter comprising a hardware counter for counting lower significant bits, a carry-borrow circuit responsive to a higher order bit position of said counter and including cancel means responsive to successively received carry and borrow signals to cancel a respectively represented carry and borrow, memory means in the carry-borrow circuit separately memorizing a received carry or borrow, means responsive to said memory means to deactivate said cancel means, and a microprocessor including an adder for counting higher significant bits and means in said microprocessor for sensing said memory means in said carry-borrow circuit for determining whether a "1" is to be added to said higher significant bits.

2. The counter set forth in claim 1 wherein said carry-borrow circuit includes decode means, said memory means including a borrow latch and a carry latch, said latches receiving setting and resetting signals from said decoding means supplying signals respectively indicative of a carry or borrow to said decoding means and to said microprocessor, and means for actuating said counter to count including a connection to said decoding means to alter status of said latches.

3. The counter set forth in claim 2 wherein said decode means includes an EXCLUSIVE-OR circuit responsive to the signal states of said latches and to a direction of count indication signal to supply a control signal in said decoder signal indicative of whether or not a borrow or carry signal indicated by said latches should be cancelled.

4. The counter set forth in claim 3 wherein said memory latches are of the JK type and said decoder means supplies input signals to said J and K inputs of both of said JK latches and said control signal clocking said latches to receive the output of said decoding means.

5. The counter set forth in claim 4 wherein said decoder means includes first, second, third and fourth AND circuits respectively connected to the said J and K inputs of said borrow latch and to said carry latch; said hardware counter supplying a borrow indication to all of said AND circuits, said EXCLUSIVE-OR circuit supplying its output to an AND circuit connected to the K input of said borrow latch and to the J input of said carry latch and an inverted output to the J input of said borrow latch and the K input of said carry latch, and said AND circuits connected to said K inputs receiving the latch indicating signals for said cancelling functions.

6. A programmable machine controller, including in combination:

tachometer circuit means for indicating operational status of a machine to be controlled, a hardware up/down counter connected to said tachometer circuit means and responsive thereto to establish a count indicative of a cumulative status of said machine being controlled, a microprocessor including an adder and a memory for controlling said machine, and means coupling said up/down counter to said microprocessor for supplying count signals thereto, including count preservation means for obviating the need for interrupting said microprocessor to capture a count related to the machine to be controlled.

7. The invention set forth in claim 6 wherein said preservation means includes cancel means for cancelling predetermined count signals which are successively received from said up/down counter.

8. The invention set forth in claim 7 wherein said coupling circuit includes memory means for memorizing count status indications, and said preservation means including a decoder responsive to receive said count status indications and to said memory means for adjusting the memory means in accordance with changing count status.

* * * * *